(12) United States Patent
Kim et al.

(10) Patent No.: US 9,761,280 B2
(45) Date of Patent: Sep. 12, 2017

(54) POWER PATH CONTROLLER OF A SYSTEM-ON-CHIP

(71) Applicant: SAMSUNG ELECTRONICS CO., LTD., Suwon-si (KR)

(72) Inventors: Se-Ki Kim, Suwon-si (KR); Dae-Yong Kim, Seoul (KR); Dong-Hun Heo, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 5 days.

(21) Appl. No.: 14/813,896

(22) Filed: Jul. 30, 2015

(65) Prior Publication Data

US 2016/0111134 A1 Apr. 21, 2016

(30) Foreign Application Priority Data

Oct. 20, 2014 (KR) .................. 10-2014-0141712

(51) Int. Cl.
*G11C 5/14* (2006.01)

(52) U.S. Cl.
CPC .............. *G11C 5/147* (2013.01); *G11C 5/143* (2013.01)

(58) Field of Classification Search
CPC .................................................... G11C 5/147
See application file for complete search history.

(56) References Cited

U.S. PATENT DOCUMENTS

| 7,508,179 | B2 | 3/2009 | Cowell et al. |
| 7,558,984 | B2 | 7/2009 | McGowan |
| 7,630,270 | B2 | 12/2009 | Ko et al. |
| 7,667,470 | B2 | 2/2010 | Audet et al. |
| 8,479,029 | B2 | 7/2013 | Safford et al. |
| 8,497,605 | B2 | 7/2013 | Kundur Subramaniyan et al. |
| 8,601,292 | B2 | 12/2013 | Lam et al. |
| 8,695,008 | B2 | 4/2014 | Regini et al. |
| 2010/0017636 | A1 | 1/2010 | Hashimoto et al. |
| 2011/0276812 | A1 | 11/2011 | Lee et al. |
| 2013/0076326 | A1 | 3/2013 | Lee |
| 2013/0090077 | A1* | 4/2013 | Rozenblit ............ H04W 52/52 455/127.2 |
| 2013/0135944 | A1* | 5/2013 | Braceras ............... G11C 5/147 365/189.07 |
| 2013/0173938 | A1 | 7/2013 | Yang |
| 2014/0025980 | A1 | 1/2014 | Liang et al. |

(Continued)

FOREIGN PATENT DOCUMENTS

| KR | 10-2011-0123698 A | 11/2011 |
| KR | 10-2013-0079076 A | 7/2013 |
| KR | 10-2013-0139829 A | 12/2013 |

*Primary Examiner* — Tri Hoang
(74) *Attorney, Agent, or Firm* — Sughrue Mion, PLLC

(57) ABSTRACT

A power path controller included in a system-on-chip (SoC) is provided. The power path controller is coupled to a first power source and a second power source. The power path controller includes a first switch located between the first power source and a memory core included in the SoC, a second switch located between the second power source and the memory core, a comparator configured to compare a first power supply voltage supplied from the first power source with a second power supply voltage supplied from the second power source, and a switch controller configured to selectively activate the first switch or the second switch according to a comparison result of the comparator.

20 Claims, 15 Drawing Sheets

(56) References Cited

U.S. PATENT DOCUMENTS

2014/0183958 A1 7/2014 Yeh et al.
2014/0250267 A1 9/2014 Sullivan
2015/0358006 A1* 12/2015 Chen ................... H03K 5/24
                 327/307

* cited by examiner

POWER PATH CONTROLLER OF A SYSTEM-ON-CHIP

CROSS-REFERENCE TO RELATED APPLICATION

This U.S. Non-provisional application claims priority under 35 USC §119 to Korean Patent Application No. 10-2014-0141712, filed on Oct. 20, 2014, in the Korean Intellectual Property Office (KIPO), the disclosure of which is incorporated by reference in its entirety herein.

BACKGROUND

1. Technical Field

Devices and articles of manufacture consistent with the present disclosure relate generally to semiconductor devices, and more particularly to a power path controller used in a system-on-chip (SoC).

2. Discussion of the Related Art

A system-on-chip (SoC) generally refers to a processing system that integrates various functional blocks (e.g., a central processing unit, a memory, an interface unit, a digital signal processing unit, an analog signal processing unit, etc.) in a single, or a few, semiconductor integrated circuits (ICs) to implement an electronic system, such as a computer system, using a limited number of ICs. Recently, SoCs have evolved to complex systems including various functions such as multimedia, graphics, interfaces, security functionality, etc. As diverse capabilities and functionality converge in portable devices that are battery-powered, efforts are ongoing to reduce power consumption in such portable devices while enhancing the performance thereof.

SUMMARY

It is an aspect to provide a power path controller for a memory core included in a system-on-chip (SoC).

According to an aspect of an exemplary embodiment, there is provided a power path controller included in a system-on-chip (SoC), the power path controller coupled to a first power source and a second power source, the power path controller comprising a first switch located between the first power source and a memory core included in the SoC; a second switch located between the second power source and the memory core; a comparator configured to compare a first power supply voltage supplied from the first power source with a second power supply voltage supplied from the second power source; and a switch controller configured to selectively activate the first switch or the second switch according to a comparison result of the comparator.

The switch controller may activate the first switch when a voltage level of the first power supply voltage is greater than a voltage level of the second power supply voltage, and may activate the second switch when the voltage level of the first power supply voltage is less than the voltage level of the second power supply voltage.

The first power supply voltage may be a power supply voltage that is dynamically changed according to an operating condition of a function block including the memory core, and the second power supply voltage may be a power supply voltage that is set to a minimum power supply voltage used by the memory core.

The first power supply voltage may be supplied to a logic block included in the function block.

The second power source may be shared by the power path controller and another power path controller included in the SoC.

The power path controller may further comprise a first resistor coupled between the switch controller and the first switch; and a second resistor coupled between the switch controller and the second switch.

The first resistor may delay rising and falling of a first switching signal applied from the switch controller to the first switch, and the second resistor may delay rising and falling of a second switching signal applied from the switch controller to the second switch.

The first switch may include a first PMOS transistor having a gate receiving a first switching signal generated by the switch controller, a source coupled to the first power source, and a drain coupled to the memory core, and the second switch may include a second PMOS transistor having a gate receiving a second switching signal generated by the switch controller, a source coupled to the second power source, and a drain coupled to the memory core.

The power path controller may further comprise a third PMOS transistor having a gate receiving the first switching signal, a source coupled to the source of the first PMOS transistor, and a drain coupled to a body of the first PMOS transistor; a first inverter configured to generate a first inverted switching signal by inverting the first switching signal; and a fourth PMOS transistor having a gate receiving the first inverted switching signal, a source coupled to the drain of the first PMOS transistor, and a drain coupled to the body of the first PMOS transistor.

When a voltage level of the first power supply voltage is greater than a voltage level of the second power supply voltage, the switch controller may generate the first switching signal having a low level, and the third PMOS transistor is turned on to transfer the first power supply voltage to the body of the first PMOS transistor in response to the first switching signal having the low level, and when the voltage level of the first power supply voltage is lower than the voltage level of the second power supply voltage, the switch controller may generate the first switching signal having a high level, the first inverter generates the first inverted switching signal having the low level in response to the first switching signal having the high level, and the fourth PMOS transistor is turned on to transfer the second power supply voltage to the body of the first PMOS transistor in response to the first inverted switching signal having the low level.

The power path controller may further comprise a fifth PMOS transistor having a gate receiving the second switching signal, a source coupled to the source of the second PMOS transistor, and a drain coupled to a body of the second PMOS transistor; a second inverter configured to generate a second inverted switching signal by inverting the second switching signal; and a sixth PMOS transistor having a gate receiving the second inverted switching signal, a source coupled to the drain of the second PMOS transistor, and a drain coupled to the body of the second PMOS transistor.

When a voltage level of the second power supply voltage is greater than a voltage level of the first power supply voltage, the switch controller may generate the second switching signal having a low level, and the fifth PMOS transistor is turned on to transfer the second power supply voltage to the body of the second PMOS transistor in response to the second switching signal having the low level, and when the voltage level of the second power supply voltage is lower than the voltage level of the first power supply voltage, the switch controller generates the second switching signal having a high level, the second inverter may generate the second inverted switching signal having the low level in response to the second switching signal having the high level, and the sixth PMOS transistor is turned on to transfer the first power supply voltage to the body of the second PMOS transistor in response to the second inverted switching signal having the low level.

The comparator may be a hysteresis comparator.

A hysteresis voltage of the hysteresis comparator may be adjusted in response to a control code applied from an external circuit.

The power path controller may further comprise a first low pass filter coupled between the first power source and a first input terminal of the comparator; and a second low pass filter coupled between the second power source and a second input terminal of the comparator.

The first low pass filter may include a resistor coupled between the first power source and the first input terminal of the comparator; a resistor coupled between the first input terminal of the comparator and a ground voltage; and a first capacitor coupled between the first input terminal of the comparator and the ground voltage, and the second low pass filter may include a resistor coupled between the second power source and the second input terminal of the comparator; a resistor coupled between the second input terminal of the comparator and the ground voltage; and a second capacitor coupled between the second input terminal of the comparator and the ground voltage.

When a voltage level of the first power supply voltage is greater than a voltage level of the second power supply voltage, the switch controller may apply a first switching signal having a low level to the first switch, and applies a second switching signal having a high level to the second switch, and when the voltage level of the first power supply voltage is lower than the voltage level of the second power supply voltage, the switch controller may apply the first switching signal having the high level to the first switch, and applies the second switching signal having the low level to the second switch.

The switch controller may include an inverter configured to generate the first switching signal by inverting an output signal of the comparator, and to apply the first switching signal to the first switch; an inverter configured to invert the output signal of the comparator; and an inverter configured to generate the second switching signal by inverting an output signal of the inverted output signal of the comparator, and to apply the second switching signal to the second switch.

The inverter that is configured to generate the second switching signal may be supplied with the first power supply voltage from the first power source, and the high level of the second switching signal is the same as the voltage level of the first power supply voltage.

The switch controller may include a multiplexer configured to selectively output a control signal or an output signal of the comparator; and a switching signal generator configured to generate a first switching signal applied to the first switch and a second switching signal applied to the second switch in response to an output signal of the multiplexer.

The control signal may be an external control signal that is received from an external circuit.

The power path controller may further comprise a detector configured to generate the control signal by detecting at least one of a temperature, a current and an operating speed of the memory core.

The first power source may be a buck converter, and the second power source may be a low dropout regulator.

According to an aspect of another exemplary embodiment, there is provided a power path controller included in a system-on-chip (SoC), the power path controller coupled to a first power source and a second power source, the power path controller comprising a first switch located between the first power source and a memory core included in the SoC; a second switch located between the second power source and the memory core; a comparator configured to compare a first power supply voltage supplied from the first power source with a second power supply voltage supplied from the second power source, the first power supply voltage being a dynamically changed power supply voltage, and the second power source being a constant power supply voltage; and a switch controller configured to activate the first switch when a voltage level of the first power supply voltage is greater than a voltage level of the second power supply voltage, and to activate the second switch when the voltage level of the first power supply voltage is lower than the voltage level of the second power supply voltage.

According to another exemplary embodiment, there is provided a power path controller included in a system-on-chip (SoC), the power path controller coupled to a first power source and to a plurality of second power sources, the power path controller comprising a first switch located between the first power source and a memory core included in the SoC; a plurality of second switches located between the second power sources and the memory core, respectively; and a switch controller configured to selectively activate the first switch or one of the second switches such that a first power supply voltage supplied from the first power source or one of a plurality of second power supply voltages supplied from the second power sources is supplied to the memory core, the first power supply voltage being a dynamically changed power supply voltage, and the second power supply voltages being constant power supply voltages having different voltage levels from one another.

The second power sources may be shared by the power path controller and another power path controller included in the SoC.

According to yet another exemplary embodiment, there is provided a power path controller included in a system-on-chip (SoC), the power path controller coupled to a first power source and to a plurality of second power sources, the power path controller comprising a plurality of first switches located between the first power source and a plurality of memory cores included in the SoC, respectively; a plurality of second switches located between the second power sources and the memory cores, respectively; and a switch controller configured to control the first switches and the second switches to selectively supply a first power supply voltage from the first power source or a second power supply voltage from a corresponding one of the second power sources to each memory core, the first power supply voltage being a dynamically changed power supply voltage, and the second power supply voltage being a constant power supply voltage.

According to yet another exemplary embodiment, there is provided a power path controller included in a system-on-chip (SoC), the power path controller comprising a comparator comprising a first input that is configured to receive a first power supply voltage and a second input that is configured to receive a second power supply voltage; a first switch that is electrically connected to the first input of the comparator and generates a first output provided to a memory core included in the SoC; a second switch that is electrically connected to the second input of the comparator and generates a second output provided to the memory core;

and a switch controller electrically connected to an output of the comparator and to the first switch and the second switch, the switch controller selectively activating the first switch or the second switch according to the output of the comparator.

The first switch may comprise a first transistor having a gate electrically connected to the switch controller, a source electrically connected to the first input of the comparator, and a drain that provides the first output to the memory core; and the second switch may comprise a second transistor having a gate electrically connected to the switching controller, a source electrically connected to the second input of the comparator, and a drain that provides the second output to the memory core.

The switch controller may activate only the first transistor to supply the first power supply voltage to the drain of the first transistor when a voltage level of the first power supply voltage is greater than a voltage level of the second power supply voltage, and may activate only the second transistor to supply the second power supply voltage to the drain of the second transistor when the voltage level of the first power supply voltage is less than the voltage level of the second power supply voltage.

The first power supply voltage received at the first input may be dynamically changed, and the second power supply voltage received at the second input may be a constant voltage.

The power path controller may share the second power supply voltage with another power path controller included in the SoC.

BRIEF DESCRIPTION OF THE DRAWINGS

Exemplary embodiments of the inventive concept will be more clearly understood from the following detailed description taken in conjunction with the accompanying drawings.

DETAILED DESCRIPTION OF EXEMPLARY EMBODIMENTS

Figure 1:
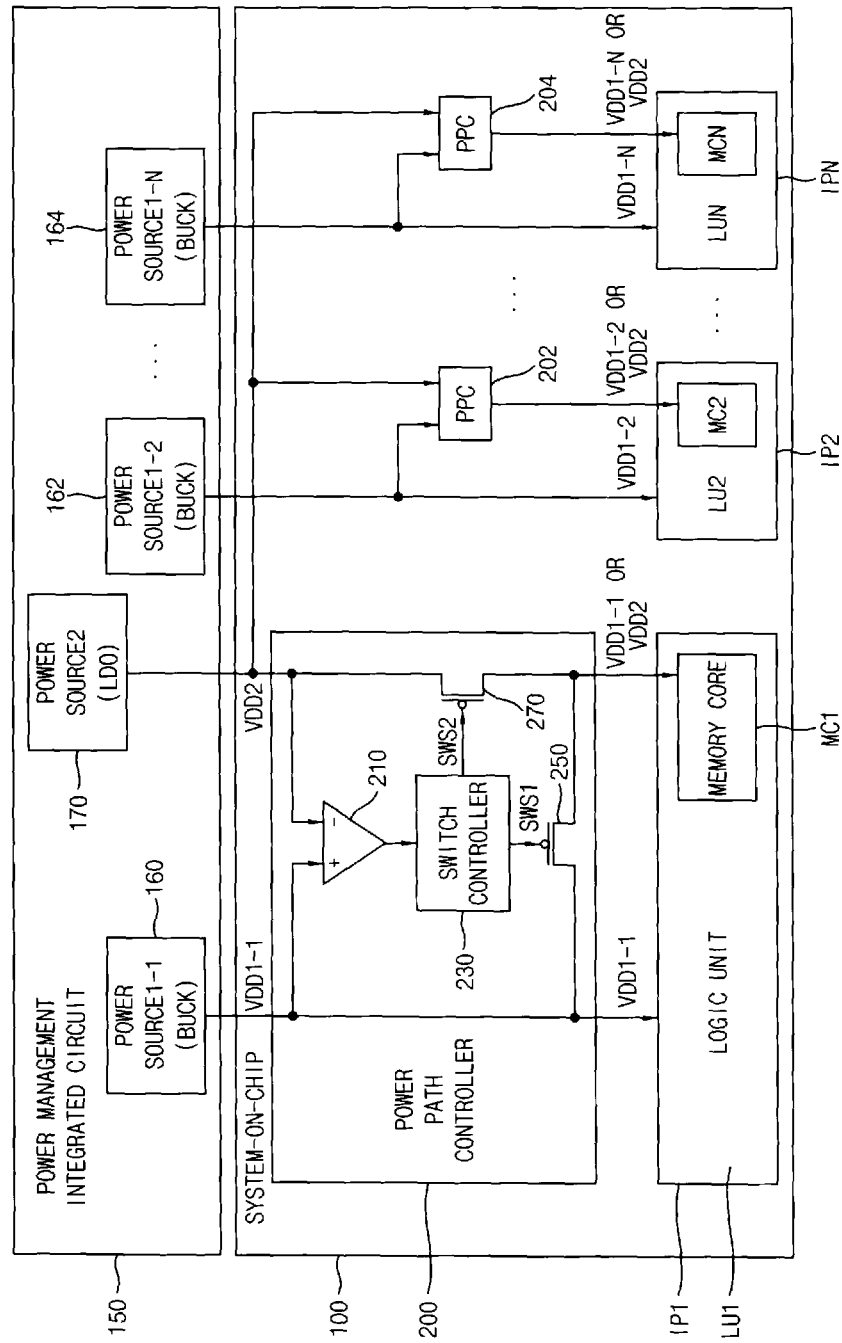
FIG. 1 is a block diagram illustrating a system-on-chip (SoC) including a power path controller (PPC) according to exemplary embodiments.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms "first", "second", "third" etc. may be used herein to describe various elements, these elements should not be limited by these terms. These terms are used to distinguish one element from another. Thus, a "first" element discussed below could be termed a "second" element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2A:
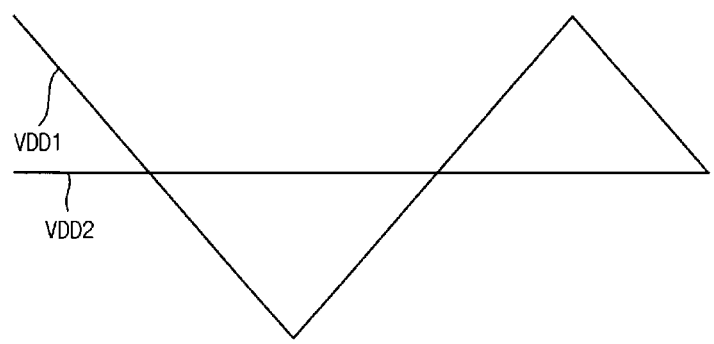
FIG. 2A is a timing diagram illustrating an example of first and second power supply voltages respectively generated by first and second power sources illustrated in FIG. 1.
Figure 2B:
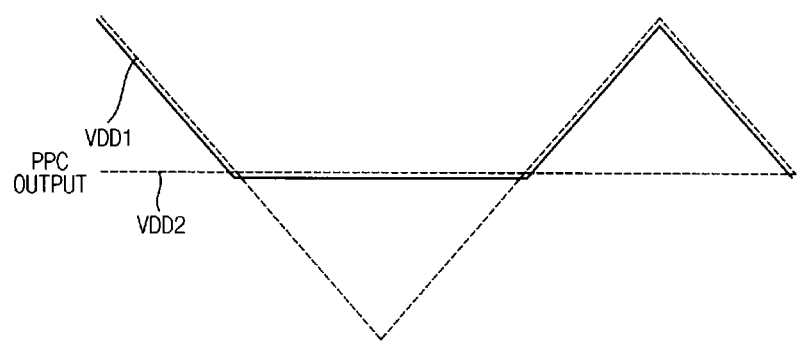
FIG. 2B is a timing diagram illustrating an example of a power supply voltage provided to a memory core by a power path controller in an example of FIG. 2A.

FIG. 1 is a block diagram illustrating a system-on-chip (SoC) including a power path controller (PPC) according to exemplary embodiments, FIG. 2A is a timing diagram illustrating an example of first and second power supply voltages respectively generated by first and second power sources illustrated in FIG. 1, and FIG. 2B is a timing diagram illustrating an example of a power supply voltage provided to a memory core by a power path controller in the example of FIG. 2A.

Referring to FIG. 1, a system-on-chip (SoC) 100 includes a plurality of function blocks IP1, IP2 and IPN. The function blocks IP1, IP2 and IPN may be circuits or intellectual properties (IPs) performing various functions. For example, the function blocks IP1, IP2 and IPN may include a central processing unit (CPU), a graphic processing unit (GPU), a bus system, an image signal processor (ISP), a multi-format codec (MFC) block, a file system (FSYS) block, a memory controller (MC), or the like.

Each function block IP1, IP2 and IPN may include a logic unit LU1, LU2 and LUN and a memory core MC1, MC2 and MCN. The memory core MC1, MC2 and MCN may include a volatile memory cell that is continuously supplied with a power supply voltage to retain stored data. In some exemplary embodiments, the memory core MC1, MC2 and MCN may include a static random access memory (SRAM) cell. In other exemplary embodiments, the memory core MC1, MC2 and MCN may include a dynamic random access memory (DRAM) cell. The logic unit LU1, LU2 and LUN may perform operations or processes for functions of each function block IP1, IP2 and IPN. The operations and the functions may be predetermined. Each logic unit LU1, LU2 and LUN may include a peripheral circuit for controlling the memory core MC1, MC2 and MCN.

In some exemplary embodiments, the logic units LU1, LU2 and LUN included in the function blocks IP1, IP2 and IPN, or the peripheral circuits included in the logic units LU1, LU2 and LUN may be supplied with power from a plurality of first power sources 160, 162 and 164 included in a power management integrated circuit (PMIC) 150, respectively. That is, the first power sources 160, 162 and 164 may supply a plurality of first power supply voltages VDD1-1, VDD1-2 and VDD1-N to the logic units LU1, LU2 and LUN, respectively. Each first power source 160, 162 and 164 may dynamically change the first power supply voltage VDD1-1, VDD1-2 and VDD1-N according to an operating condition (e.g., a throughput or a operating speed) of a corresponding one of the function block IP1, IP2 and IPN. In some exemplary embodiments, to reduce power consumption of the SoC 100, a dynamic voltage frequency scaling (DVFS) technique that dynamically changes a power supply voltage and/or an operating frequency may be applied to the SoC 100. For example, when a first function is operated with a low throughput or a low operating speed, a first power source 160 that supplies power to the logic unit LU1 of the first function block IP1 may decrease a voltage level of the first power supply voltage VDD1-1 applied to the logic unit LU1 of the first function block IP1 to reduce the power consumption.

In some cases, the operating conditions of the function blocks IP1, IP2, ..., IPN may be different from each other, and thus voltage levels of the first power supply voltages VDD1-1, VDD1-2 and VDD1-N supplied to the function blocks IP1, IP2 and IPN may be different from each other. In some exemplary embodiments, the function blocks IP1, IP2 and IPN may belong to the different power domains, the function blocks IP1, IP2 and IPN may be supplied with the first power supply voltages VDD1-1, VDD1-2 and VDD1-N from the first power sources 160, 162 and 164, respectively, and the respective first power sources 160, 162 and 164 may generate the first power supply voltages VDD1-1, VDD1-2 and VDD1-N having voltage levels that are suitable for the corresponding function blocks IP1, IP2 and IPN. Accordingly, the power consumption of the function blocks IP1, IP2 and IPN may be minimized, and thus the power consumption of the SoC 100 may be minimized. In some exemplary embodiments, to have high power efficiency, the first power sources 160, 162 and 164 may be implemented with buck converters (BUCK) having high power conversion efficiency. For example, a power supply voltage from a battery of an electronic device may be converted into the first power supply voltages VDD1-1, VDD1-2 and VDD1-N by the buck converters, and thus the power efficiency of the electronic device may be improved.

However, in some cases operation stability of memory cells may not be ensured at a low power supply voltage since a distribution of characteristics of the memory cells has widened as the semiconductor manufacturing process has been continuously developed, and thus the minimum power supply voltage for a normal operation of the memory cores MC1, MC2 and MCN may be higher than the minimum power supply voltage for a normal operation of the logic units LU1, LU2 and LUN. Accordingly, to supply the memory cores MC1, MC2 and MCN with a power supply voltage greater than or equal to the minimum power supply voltage used by the memory cores MC1, MC2 and MCN, the SoC 100 may further include a plurality of power path controllers 200, 202 and 204 that are commonly coupled to at least one second power source 170 generating a second power supply voltage VDD2 that is a power supply voltage greater than or equal to the minimum power supply voltage required by the memory cores MC1, MC2, ..., MCN. The second power supply voltage VDD2 may be a fixed power supply voltage that is held constant. In some exemplary embodiments, to generate the second power supply voltage VDD2 that is stable with less noise (e.g., ripple), the second power source 170 may be implemented with a low dropout (LDO) regulator. Further, in some exemplary embodiments, to improve the power efficiency, the power supply voltage of the battery may be first converted by a buck converter, and then may be converted again into the second power supply voltage VDD2 by the LDO regulator.

Each power path controller 200, 202 and 204 may compare the first power supply voltage VDD1-1, VDD1-2 and VDD1-N from a corresponding one of the first power sources 160, 162 and 164 with the second power supply voltage VDD2 from the second power source 170, and may selectively provide the first power supply voltage VDD1-1, VDD1-2 and VDD1-N or the second power supply voltage VDD2 to a corresponding one of the memory cores MC1, MC2 and MCN according to a result of the comparison. Thus, while the power supply voltage suitable for the operating condition of each function block IP1, IP2 and IPN is supplied to the corresponding memory core MC1, MC2 and MCN, it may be ensured that the power supply voltage supplied to the corresponding memory core MC1, MC2 and MCN is greater than or equal to the minimum power supply voltage used by the memory core MC1, MC2 and MCN. To perform this operation, each power path controller 200, 202 and 204 may include a first switch 250, a second switch 270, a comparator 210 and a switch controller 230. The switch controller 230 may be a switch control circuit.

The first switch 250 may be located between the first power source 160 generating the first power supply voltage VDD1-1, and may be selectively turned on in response to a first switching signal SWS1 generated by the switch controller 230. For example, the first switch 250 may be implemented with a first PMOS transistor having a gate receiving the first switching signal SWS1, a source coupled to the first power source 160, and a drain coupled to the memory core MC1.

The second switch 270 may be located between the second power source 170 generating the second power supply voltage VDD2, and may be selectively turned on in response to a second switching signal SWS2 generated by the switch controller 230. For example, the second switch 270 may be implemented with a second PMOS transistor having a gate receiving the second switching signal SWS2, a source coupled to the second power source 170, and a drain coupled to the memory core MC1.

The comparator 210 may compare the first power supply voltage VDD1-1 supplied from the first power source 160 with the second power supply voltage VDD2 supplied from the second power source 170, and the switch controller 230 may selectively activate the first switch 250 or the second switch 270 according to a comparison result of the comparator 210. For example, when a voltage level of the first power supply voltage VDD1-1 is higher than a voltage level of the second power supply voltage VDD2, the switch controller 230 may generate the first switching signal SWS1 having a low level and the second switching signal having a high level to activate the first switch 250 and to deactivate the second switch 270. When the voltage level of the first power supply voltage VDD1-1 is lower than the voltage level of the second power supply voltage VDD2, the switch controller 230 may generate the first switching signal SWS1 having the high level and the second switching signal having the low level to deactivate the first switch 250 and to activate the second switch 270.

As described above, the first power supply voltage VDD1-1 is a power supply voltage that is dynamically changed according to the operating condition of the function block IP1, and the second power supply voltage VDD2 is a power supply voltage that is set to the minimum power supply voltage used by the memory core MC1. For example, as illustrated in FIG. 2A, the voltage level of the first power supply voltage VDD1 may be dynamically changed over time, and the voltage level of the second power supply voltage VDD2 may be set at a constant voltage level. In this case, to dynamically change the power supply voltage applied to the memory core MC1 according to the operating condition of the function block IP1 while maintaining the power supply voltage greater than or equal to the minimum power supply voltage used by the memory core MC1, the power path controller 200 may compare the first power supply voltage VDD1 with the second power supply voltage VDD2, and may selectively output the first power supply voltage VDD1 or the second power supply voltage VDD2 according to a result of the comparison. For example, as illustrated in FIG. 2B, while the voltage level of the first power supply voltage VDD1 is higher than the voltage level of the second power supply voltage VDD2, the first switch 250 may be activated, and, as an output (PPC OUTPUT) of the power path controller 200, the dynamically changed first power supply voltage VDD1 may be supplied to the memory core MC1. While the voltage level of the first power supply voltage VDD1 is lower than the voltage level of the second power supply voltage VDD2, the second switch 270 may be activated, and, as the output (PPC OUTPUT) of the power path controller 200, the second power supply voltage VDD2 may be supplied to the memory core MC1. Accordingly, the normal operation of the memory core MC1 may be ensured while the power consumption of the function block IP1 may be reduced.

To ensure that power supply voltages greater than or equal to the minimum power supply voltage used for the normal operation of the memory cores MC1, MC2 and MCN while the power supply voltages corresponding to current operating conditions of the function blocks IP1, IP2 and IPN are supplied to the function blocks IP1, IP2 and IPN, respectively, a related art SoC is coupled not only to a plurality of first power sources for respectively supplying power to the function blocks IP1, IP2 and IPN but also to a plurality of second power sources for respectively supplying power to the memory cores MC1, MC2 and MCN, and each second power source for the related art SoC dynamically changes the power supply voltage supplied to the corresponding memory core MC1, MC2 and MCN according to the operating condition while maintaining the power supply voltage greater than or equal to the minimum power supply voltage. Accordingly, in the conventional SoC, a number of power sources are required to supply power to the memory cores MC1, MC2 and MCN, and a number of power supply lines are required between the memory cores MC1, MC2 and MCN and the power sources.

However, in the SoC 100 according to exemplary embodiments, the power path controllers 200, 202 and 204 may be located corresponding to the memory cores MC1, MC2 and MCN, and the power path controllers 200, 202 and 204 may share the second power source 170. Accordingly, in the SoC 100 according to exemplary embodiments, the number of the second power source 170 included in the PMIC 150 may be reduced, the number of passive elements (e.g., capacitors) for the second power source 170 may be reduced, and the number of power supply lines between the PMIC 150 and the SoC 100 may be reduced.

As described above, the power path controller 200 according to exemplary embodiments may compare the first power supply voltage VDD1-1 that is dynamically changed according to the operating condition of the function block IP1 with the second power supply voltage VDD2 that is fixed to the minimum power supply voltage used by the memory core MC1, and may selectively supply the first power supply voltage VDD1-1 or the second power supply voltage VDD2 to the memory core MC1 according to the result of the comparison, thereby ensuring the normal operation of the memory core MC1 while reducing the power consumption. Further, the SoC 100 according to exemplary embodiments may employ the power path controllers 200, 202 and 204 that are commonly coupled to the second power sources generating the second power supply voltage VDD2, thereby reducing the number of the second power source 170 in the PMIC 150, the number of the passive elements and the number of the power supply lines between the PMIC 150 and the SoC 100.

Figure 3:
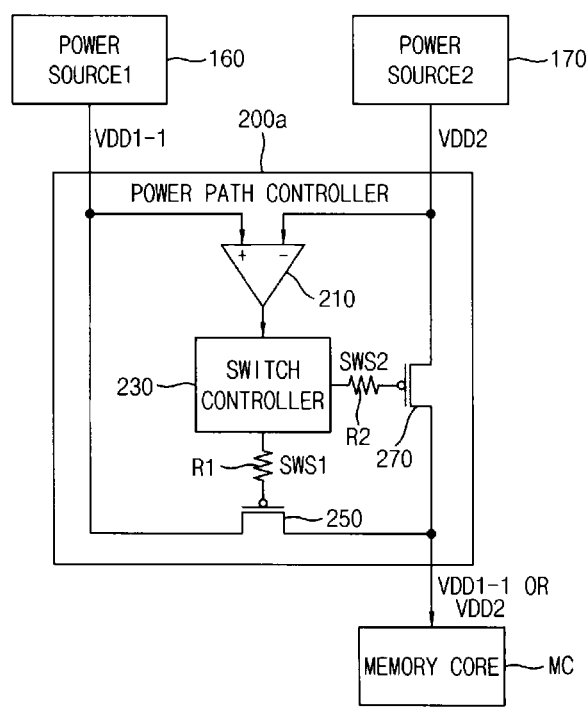
FIG. 3 is a block diagram illustrating a power path controller according to exemplary embodiments.
Figure 4:
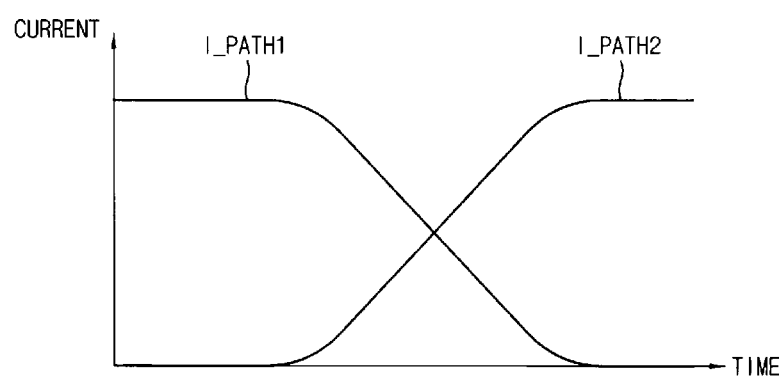
FIG. 4 is a graph illustrating currents flowing through respective power supply paths during power path switching by a power path controller of FIG. 3.

FIG. 3 is a block diagram illustrating a power path controller according to exemplary embodiments, and FIG. 4 is a graph illustrating currents flowing through respective power supply paths during power path switching by a power path controller of FIG. 3.

Referring to FIG. 3, a power path controller 200a may include a first switch 250 located between a first power source 160 and a memory core MC, a second switch 270 located between a second power source 170 and the memory core MC, a comparator 210 that compares a first power supply voltage VDD1-1 from the first power source 160 with a second power supply voltage VDD2 from the second power source 170, a first resistor R1 and a second resistor R2, and a switch controller 230 that controls the first and second switches 250 and 270 in response to an output signal of the comparator 210. The first power source 160 may generate the first power supply voltage VDD1-1 that is dynamically changed according to an operating condition of a function block including the memory core MC, and the second power source 170 may generate the second power supply voltage VDD2 that may be set to a minimum power supply voltage used by the memory core MC. The second power supply voltage VDD2 may be fixed to a constant voltage. The second power source 170 may be shared by the power path controller 200a and another power path controller included in a SoC. That is, the power path controller 200a and the another power path controller may be commonly coupled to the second power source 170, and the power path controller 200a and the another power path controller may receive the same second power supply voltage VDD2 from the second power source 170. Compared with a power path controller 200 illustrated in FIG. 1, the power path controller 200a of FIG. 3 may further include the first and second resistors R1 and R2.

The first resistor R1 may be coupled between the switch controller 230 and the first switch 250. Thus, the first resistor R1 may delay rising and falling of a first switching signal SWS1 applied from the switch controller 230 to the first switch 250. The second resistor R2 may be coupled between the switch controller 230 and the second switch 270. Thus, the second resistor R2 may delay rising and falling of a second switching signal SWS2 applied from the switch controller 230 to the second switch 270. That is, the first and second resistors R1 and R2 may allow the first and second switching signals SWS1 and SWS2 respectively to gradually rise or fall, thereby preventing voltage/current peaking caused by a sudden switch of power supply paths to the memory core MC.

For example, when the dynamically changed first power supply voltage VDD1-1 becomes lower than the second power supply voltage VDD2, the power path controller 200a may switch from a first power supply path from the first power source 160 to the memory core MC to a second power supply path from the second power source 170 to the memory core MC. At this time, since this power supply path switching is performed while a current flows into the memory core, the sudden switch of the power supply paths may cause the voltage/current peaking. However, in the power path controller 200a according to exemplary embodiments, since the first and second switching signals SWS1 and SWS2 may gradually rise or fall because of the first and second resistors R1 and R2 respectively, the power supply path switching may be gradually performed. For example, as illustrated in FIG. 4, when the first power supply path is switched with the second power supply path, a current I_PATH1 of the first power supply path from the first power source 160 to the memory core MC may be gradually decreased, and a current I_PATH2 from the second power source 170 to the memory core MC may be gradually increased, which results in the prevention of the voltage/current peaking.

As described above, the power path controller 200a according to exemplary embodiments may selectively transfer the dynamically changed first power supply voltage VDD1-1, or the fixed second power supply voltage VDD2 to the memory core MC, thereby ensuring the normal operation of the memory core MC while reducing the power consumption. Further, the power path controller 200a according to exemplary embodiments may include the first and second resistors R1 and R2 between the switch controller 230 and the first and second switches 250 and 270 respectively, thereby preventing the voltage/current peaking caused by the sudden switch of the power supply paths. Further, the power path controller 200a according to exemplary embodiments may share the second power source 170 with another power path controller, thereby reducing the number of power sources, the number of passive elements and the number of power supply lines.

Figure 5:
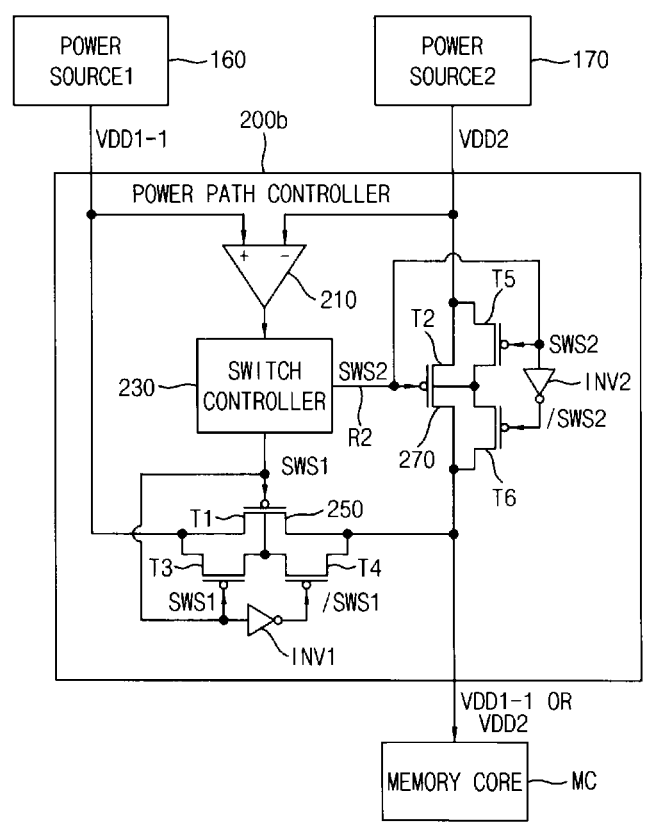
FIG. 5 is a block diagram illustrating a power path controller according to exemplary embodiments.

FIG. 5 is a block diagram illustrating a power path controller according to exemplary embodiments.

Referring to FIG. 5, a power path controller 200b may include a first switch 250 located between a first power source 160 and a memory core MC, a second switch 270 located between a second power source 170 and the memory core MC, a comparator 210 that compares a first power supply voltage VDD1-1 from the first power source 160 with a second power supply voltage VDD2 from the second power source 170, third through sixth PMOS transistors T3, T4, T5 and T6 and first, second inverters INV1 and INV2 and a switch controller 230 that controls the first and second switches 250 and 270 in response to an output signal of the comparator 210. Compared with a power path controller 200 illustrated in FIG. 1, the power path controller 200b of FIG. 5 may further include the third through sixth PMOS transistors T3, T4, T5 and T6 and first and second inverters INV1 and INV2.

The first switch 250 may be a first PMOS transistor T1 250 having a gate receiving a first switching signal SWS1, a source coupled to the first power source 160, and a drain coupled to the memory core MC. The third PMOS transistor T3 may have a gate receiving the first switching signal SWS1, a source coupled to the source of the first PMOS transistor T1 250, and a drain coupled to a body of the first PMOS transistor T1 250. The first inverter INV1 may generate a first inverted switching signal /SWS1 by inverting the first switching signal SWS1. The fourth PMOS transistor T4 may have a gate receiving the first inverted switching signal /SWS1, a source coupled to the drain of the first PMOS transistor T1 250, and a drain coupled to the body of the first PMOS transistor T1 250.

The third and fourth PMOS transistors T3 and T4 and the first inverter INV1 may apply a higher one of a voltage of the source of the first PMOS transistor T1 250 and a voltage of the drain of the first PMOS transistor T1 250 to the body of the first PMOS transistor T1 250. For example, when a voltage level of the first power supply voltage VDD1-1 is higher than a voltage level of the second power supply voltage VDD2, the switch controller 230 may generate the first switching signal SWS1 having a low level, and the third PMOS transistor T3 may be turned on in response to the first switching signal SWS1 having the low level. The turned-on third PMOS transistor T3 may transfer the first power supply voltage VDD1-1 to the body of the first PMOS transistor T1 250. When the voltage level of the first power supply voltage VDD1-1 is lower than the voltage level of the second power supply voltage VDD2, the switch controller 230 may generate the first switching signal SWS1 having a high level, the first inverter INV1 may generate the first inverted switching signal /SWS1 having the low level in response to the first switching signal SWS1 having the high level, and the fourth PMOS transistor T4 may be turned on in response to the first inverted switching signal /SWS1 having the low level. The turned-on fourth PMOS transistor T4 may transfer the second power supply voltage VDD2 to the body of the first PMOS transistor T1 250. Accordingly, the higher one of the voltages of the source and drain of the first PMOS transistor T1 250 is applied to the body of the first PMOS transistor T1 250, and thus a current leakage through the body of the first PMOS transistor T1 250 may be prevented.

The second switch 270 may be a second PMOS transistor T2 270 having a gate receiving a second switching signal SWS2, a source coupled to the second power source 170, and a drain coupled to the memory core MC. The fifth PMOS transistor T5 may have a gate receiving the second switching signal SWS2, a source coupled to the source of the second PMOS transistor T2 270, and a drain coupled to a body of the second PMOS transistor T2 270. The second inverter INV2 may generate a second inverted switching signal /SWS2 by inverting the second switching signal SWS2. The sixth PMOS transistor T6 may have a gate receiving the second inverted switching signal /SWS2, a source coupled to the drain of the second PMOS transistor T2 270, and a drain coupled to the body of the second PMOS transistor T2 270.

The fifth and sixth PMOS transistors T5 and T6 and the second inverter INV2 may apply a higher one of a voltage of the source of the second PMOS transistor T2 270 and a voltage of the drain of the second PMOS transistor T2 270 to the body of the second T2 PMOS transistor T2 270. For example, when the voltage level of the second power supply voltage VDD2 is higher than the voltage level of the first power supply voltage VDD1-1, the switch controller 230 may generate the second switching signal SWS2 having a low level, and the fifth PMOS transistor T5 may be turned on in response to the second switching signal SWS2 having the low level. The turned-on fifth PMOS transistor T5 may transfer the second power supply voltage VDD2 to the body of the second PMOS transistor T2 270. When the voltage level of the second power supply voltage VDD2 is lower than the voltage level of the first power supply voltage VDD1-1, the switch controller 230 may generate the second switching signal SWS2 having a high level, the second inverter INV2 may generate the second inverted switching signal /SWS2 having the low level in response to the second switching signal SWS2 having the high level, and the sixth PMOS transistor T6 may be turned on in response to the second inverted switching signal /SWS2 having the low level. The turned-on sixth PMOS transistor T6 may transfer the first power supply voltage VDD1-1 to the body of the second PMOS transistor T2 270. Accordingly, the higher one of the voltages of the source and drain of the second PMOS transistor T2 270 is applied to the body of the second PMOS transistor T2 270, and thus a current leakage through the body of the first PMOS transistor T1 250 may be prevented.

Figure 6:
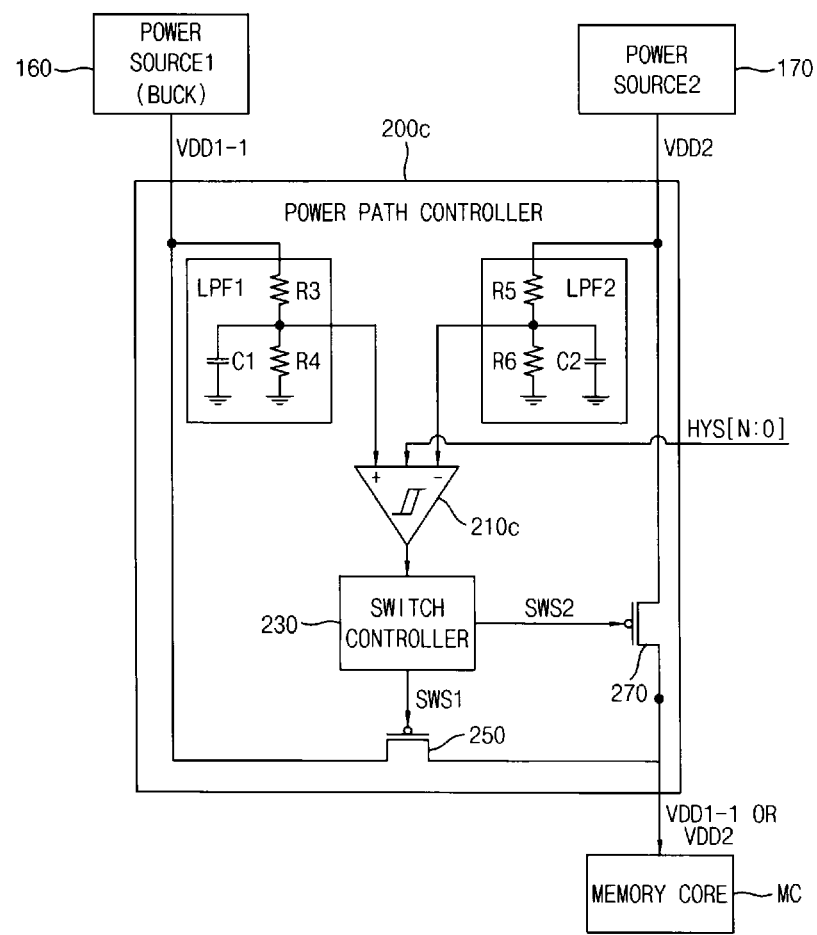
FIG. 6 is a block diagram illustrating a power path controller according to exemplary embodiments.

FIG. 6 is a block diagram illustrating a power path controller according to exemplary embodiments.

Referring to FIG. 6, a power path controller 200c may include a first switch 250 located between a first power source 160 and a memory core MC, a second switch 270 located between a second power source 170 and the memory core MC, a comparator 210c that compares a first power supply voltage VDD1-1 from the first power source 160 with a second power supply voltage VDD2 from the second power source 170, a switch controller 230 that controls the first and second switches 250 and 270 respectively in response to an output signal of the comparator 210c, a first low pass filter LPF1 coupled between the first power source 160 and the comparator 210c, and a second low pass filter LPF2 coupled between the second power source 170 and the comparator 210c. The power path controller 200c of FIG. 6 may have a similar configuration to a power path controller 200 illustrated in FIG. 1, except that the power path controller 200c may further include the first and second low pass filters LPF1 and LPF2, and that a configuration or operation of the comparator 210c is different from that of the power path controller 200.

The first low pass filter LPF1 may be coupled between the first power source 160 and a first input terminal (e.g., a non-inverting input terminal) of the comparator 210c. For example, the first low pass filter LPF1 may include a third resistor R3 coupled between the first power source 160 and the first input terminal of the comparator 210c, a fourth resistor R4 coupled between the first input terminal of the comparator 210c and a ground voltage, and a first capacitor C1 coupled between the first input terminal of the comparator 210c and the ground voltage. In some exemplary embodiments, the first power source 160 generating the first power supply voltage VDD1-1 may be implemented with a buck converter having high power conversion efficiency, and the first power supply voltage VDD1-1 generated by the buck converter may have a high-frequency noise component, such as a ripple. However, the first low pass filter LPF1 may remove the high-frequency noise component of the first power supply voltage VDD1-1.

The second low pass filter LPF2 may be coupled between the second power source 170 and a second input terminal (e.g., an inverting input terminal) of the comparator 210c. For example, the second low pass filter LPF2 may include a fifth resistor R5 coupled between the second power source 170 and the second input terminal of the comparator 210c, a sixth resistor R6 coupled between the second input terminal of the comparator 210c and the ground voltage, and a second capacitor C2 coupled between the second input terminal of the comparator 210c and the ground voltage. The first low pass filter LPF2 may remove a high-frequency noise component of the second power supply voltage VDD2. Accordingly, since the power path controller 200c includes the first and second low pass filters LPF1 and LPF2 for removing the noise component of the first and second power supply voltages VDD1-1 and VDD2, undesired power path switching or repeated switching caused by a noise of the first and second power supply voltages VDD1-1 and VDD2 may be prevented.

In some exemplary embodiments, the comparator 210c may be a hysteresis comparator. For example, when the first power supply voltage VDD1-1 is currently output from the power path controller 200c, the comparator 210c may generate an output signal indicating the first power supply voltage VDD1-1 until the first power supply voltage VDD1-1 becomes lower by a first voltage difference corresponding to a hysteresis voltage of the comparator 210c than the second power supply voltage VDD2, and may generate the output signal indicating the second power supply voltage VDD2 after the first power supply voltage VDD1-1 becomes lower by more than the first voltage difference than the second power supply voltage VDD2. The first voltage difference may be predetermined. Further, when the second power supply voltage VDD2 is currently output from the power path controller 200c, the comparator 210c may generate an output signal indicating the second power supply voltage VDD2 until the first power supply voltage VDD1-1 becomes higher by a second voltage difference corresponding to the hysteresis voltage of the comparator 210c than the second power supply voltage VDD2, and may generate the output signal indicating the first power supply voltage VDD1-1 after the first power supply voltage VDD1-1 becomes higher by more than the second voltage difference than the second power supply voltage VDD2. The second voltage difference may be predetermined. Accordingly, even if the first power supply voltage VDD1-1 or the second power supply voltage VDD2 is undesirably changed by a change of a load current of the memory core MC, undesired power path switching or repeated switching may be prevented.

In some exemplary embodiments, the hysteresis voltage of the comparator 210c may be adjusted in response to a control code HYS[N:0] applied from an external circuit. For example, values of the control code HYS[N:0] may be set such that the hysteresis voltage of the comparator 210c may be adjusted according to a load current, input parasitic resistance, etc.

Figure 7:
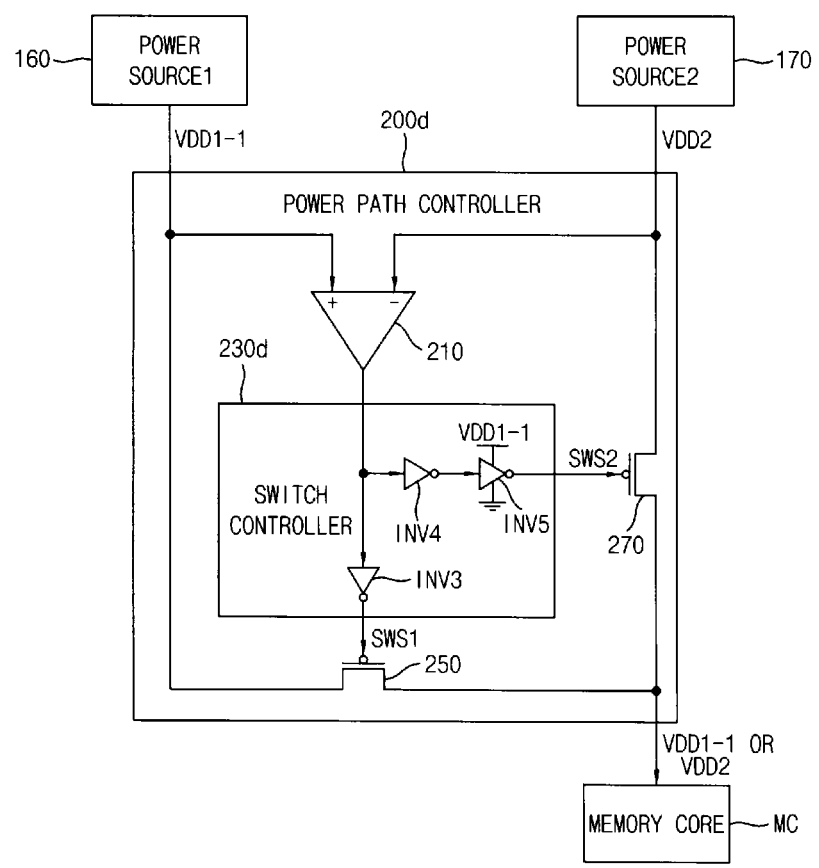
FIG. 7 is a block diagram illustrating a power path controller according to exemplary embodiments.

FIG. 7 is a block diagram illustrating a power path controller according to exemplary embodiments.

Referring to FIG. 7, a power path controller 200d may include a first switch 250 located between a first power source 160 and a memory core MC, a second switch 270 located between a second power source 170 and the memory core MC, a comparator 210 that compares a first power supply voltage VDD1-1 from the first power source 160 with a second power supply voltage VDD2 from the second power source 170, and a switch controller 230d that controls the first and second switches 250 and 270 respectively in response to an output signal of the comparator 210. The power path controller 200d of FIG. 7 may have a similar configuration to a power path controller 200 illustrated in FIG. 1, except for a configuration or operation of the switch controller 230d.

When a voltage level of the first power supply voltage VDD1-1 is higher than a voltage level of the second power supply voltage VDD2, the switch controller 230d may apply a first switching signal SWS1 having a low level to the first switch 250, and apply a second switching signal SWS2 having a high level to the second switch 270. Further, when the voltage level of the first power supply voltage VDD1-1 is lower than the voltage level of the second power supply voltage VDD2, the switch controller 230d may apply the first switching signal SWS1 having a high level to the first switch 250, and apply the second switching signal SWS2 having a low level to the second switch 270. To perform this operation, in some exemplary embodiments, the switch controller 230d may include a third inverter INV3, a fourth inverter INV4 and a fifth inverter INV5. The third inverter INV3 may generate the first switching signal SWS1 by inverting an output signal of the comparator 210, and may apply the first switching signal SWS1 to the first switch 250. The fourth inverter INV4 may invert the output signal of the comparator 210. The fifth inverter INV5 may generate the second switching signal SWS2 by inverting an output signal of the fourth inverter INV4, and may apply the second switching signal SWS2 to the second switch 270.

In some exemplary embodiments, the fifth inverter INV5 may be supplied with the first power supply voltage VDD1-1 from the first power source VDD1-1. If the voltage level of the first power supply voltage VDD1-1 is higher than the voltage level of the second power supply voltage VDD2, and the second switching signal SWS2 having a voltage level the same as the voltage level of the second power supply voltage VDD2 is applied to the second switch 270, a voltage (e.g., the first power supply voltage VDD1-1) applied to a source/drain of the second switch 270 may be higher than a voltage (having the same voltage level as the second power supply voltage VDD2) applied to a gate of the second switch 270, and thus a current may flow from the memory core MC through the second switch 270 to the second power source 170. However, in the power path controller 200d according to exemplary embodiments, since the fifth inverter INV5 is supplied with the first power supply voltage VDD1-1, the second switching signal SWS2 may have a voltage level the same as the voltage level of the first power supply voltage VDD1-1, and thus the current leakage through the second switch 270 may be prevented.

Figure 8:
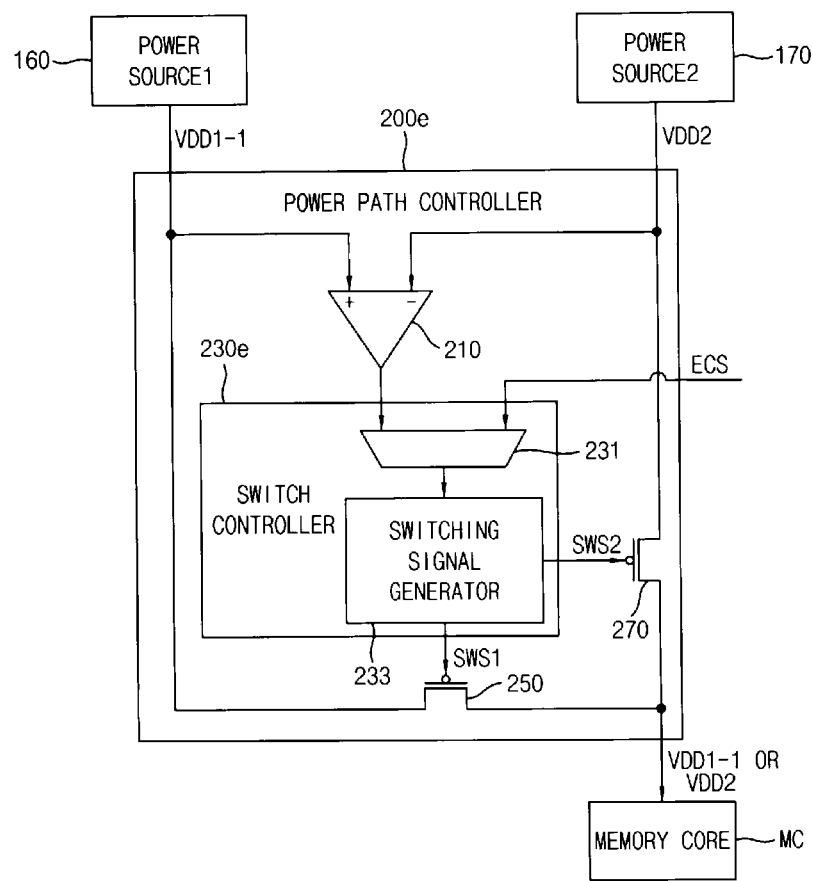
FIG. 8 is a block diagram illustrating a power path controller according to exemplary embodiments.

FIG. 8 is a block diagram illustrating a power path controller according to exemplary embodiments.

Referring to FIG. 8, a power path controller 200e may include a first switch 250 located between a first power source 160 and a memory core MC, a second switch 270 located between a second power source 170 and the memory core MC, a comparator 210 that compares a first power supply voltage VDD1-1 from the first power source 160 with a second power supply voltage VDD2 from the second power source 170, and a switch controller 230e that controls the first and second switches 250 and 270 respectively in response to an output signal of the comparator 210. The power path controller 200e of FIG. 8 may have a similar configuration to a power path controller 200 illustrated in FIG. 1, except for a configuration or operation of the switch controller 230e.

The switch controller 230e may include a multiplexer 231 and a switching signal generator 223. The multiplexer 231 may receive an output signal of the comparator 210, and may receive an external control signal ECS from an external circuit or device. The multiplexer 231 may selectively output the output signal of the comparator 210 or the external control signal ECS. The switching signal generator 223 may generate a first switching signal SWS1 applied to the first switch 250 and a second switching signal SWS2 applied to the second switch 270 in response to an output signal of the multiplexer 231 (i.e., the output signal of the comparator 210 or the external control signal ECS). For example, the switching signal generator 223 may include third through fifth inverters INV3, INV4 and INV5 illustrated in FIG. 7.

In some exemplary embodiments, the external control signal ECS may be generated based on a temperature, a current, an operating speed, etc. of the memory core MC, or a function block including the memory core MC, and the switching signal generator 223 may control the first and second switches 250 and 270 respectively according to the external control signal ECS generated based on the temperature, the current, the operating speed, etc. In some exemplary embodiments, an external function block may generate the external control signal ECS by executing a code that is set and/or programmed in software, and may provide the external control signal ECS to the power path controller 200e.

Figure 9:
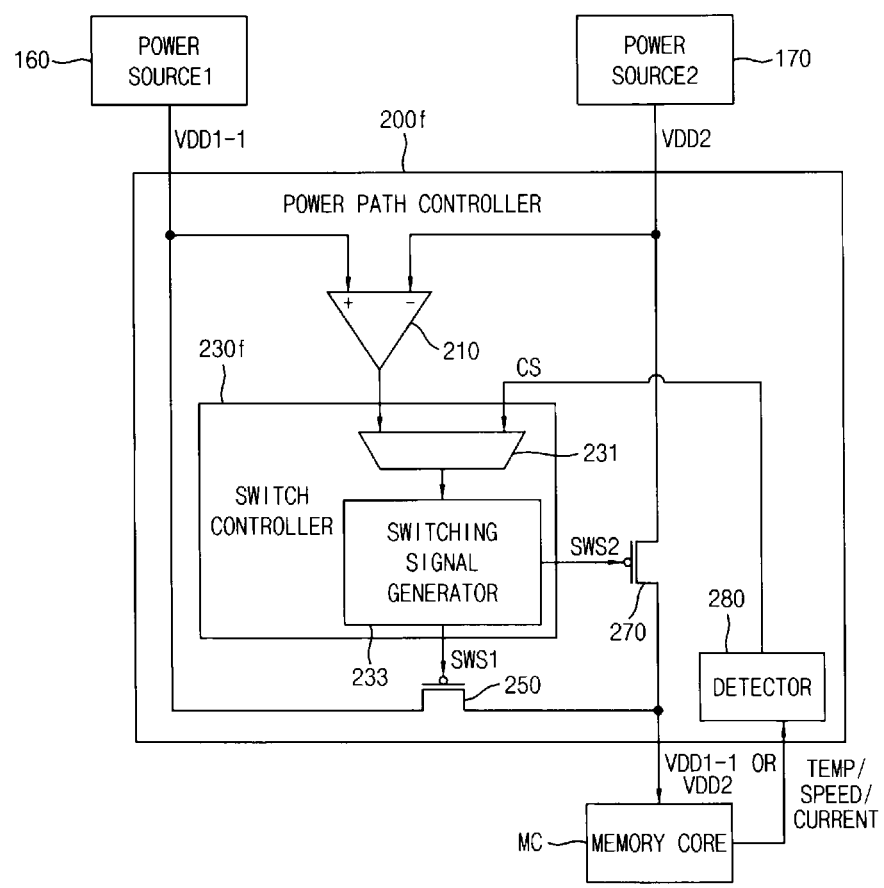
FIG. 9 is a block diagram illustrating a power path controller according to exemplary embodiments.

FIG. 9 is a block diagram illustrating a power path controller according to exemplary embodiments.

Referring to FIG. 9, a power path controller 200f may include a first switch 250 located between a first power source 160 and a memory core MC, a second switch 270 located between a second power source 170 and the memory core MC, a comparator 210 that compares a first power supply voltage VDD1-1 from the first power source 160 with a second power supply voltage VDD2 from the second power source 170, a switch controller 230f that controls the first and second switches 250 and 270 respectively in response to an output signal of the comparator 210, and a detector 280. The power path controller 200f of FIG. 9 may have a similar configuration to a power path controller 200e illustrated in FIG. 8, except that the power path controller 200f further includes the detector 280.

The detector 280 may generate a control signal CS by detecting at least one of a temperature, a current, an operating speed, etc. of the memory core MC (or a function block including the memory core MC). A multiplexer 231 may selectively output an output signal of the comparator 210, or the control signal CS, and a switching signal generator 233 may generate a first switching signal SWS1 applied to the first switch 250 and a second switching signal SWS2 applied to the second switch 270 in response to an output signal of the multiplexer 231 (i.e., the output signal of the comparator 210 or the control signal CS). Accordingly, the first and second switches 250 and 270 may be controlled not only based on the comparison of the first and second power supply voltages VDD1-1 and VDD2 but also based on the temperature, the current, the operating speed, etc. of the memory core MC.

Figure 10:
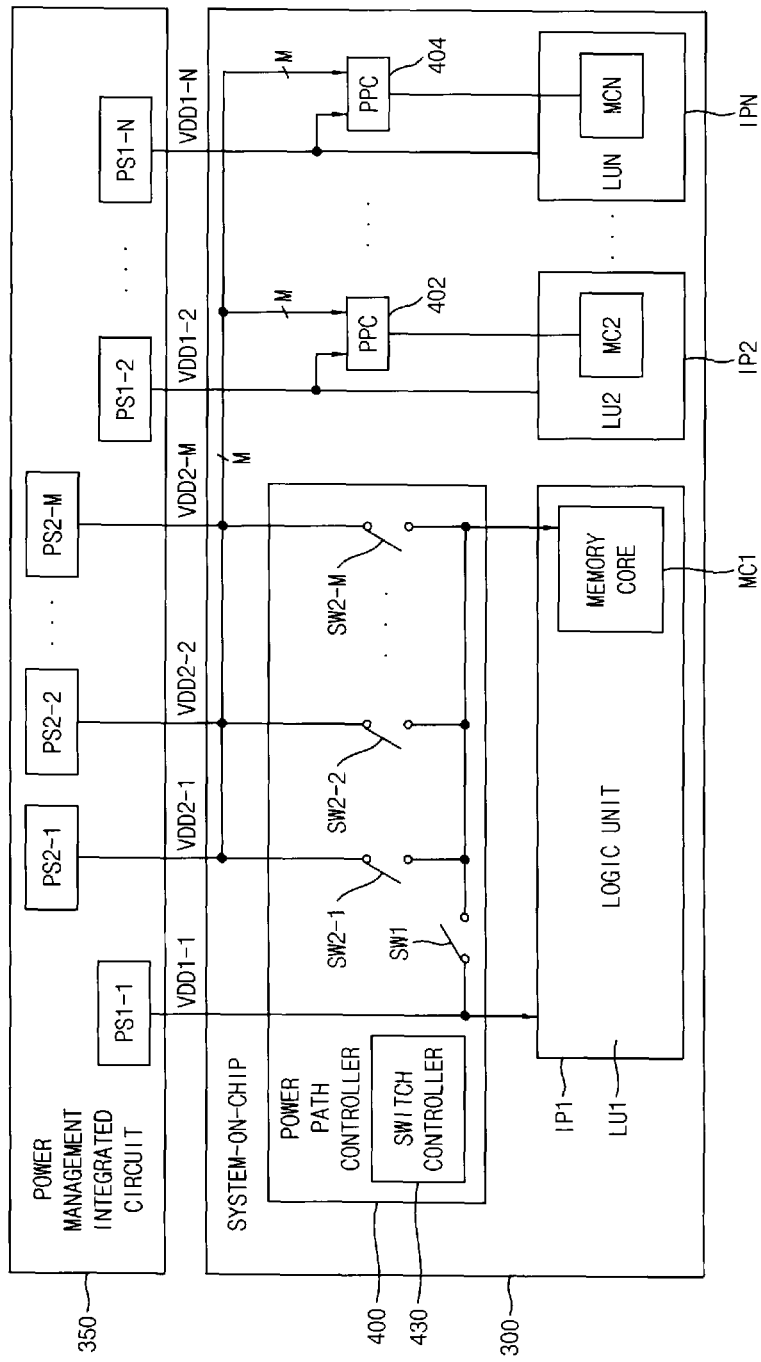
FIG. 10 is a block diagram illustrating a SoC including a power path controller according to exemplary embodiments.

FIG. 10 is a block diagram illustrating a SoC including a power path controller according to exemplary embodiments.

Referring to FIG. 10, a SoC 300 includes a plurality of function blocks IP1, IP2 and IPN and a plurality of power path controllers 400, 402 and 404. The SoC 300 may be supplied with power from a PMIC 350. In some exemplary embodiments, the SoC 300 may be supplied with a plurality of dynamically changed first power supply voltages VDD1-1, VDD1-2 and VDD1-N from a plurality of first power sources (e.g., N first power sources) PS1-1, PS1-2 and PS1-N, and may be supplied with a plurality of power supply voltages VDD2-1, VDD2-2 and VDD2-M, having different voltage levels, from a plurality of second power sources (e.g., M second power sources, where each of N and M is an integer greater than 0, and, in some exemplary embodiments, M is less than N) PS2-1, PS2-2 and PS2-M. The second power supply voltages may be set to a constant voltage.

For example, a plurality of logic units LU1, LU2 and LUN (or peripheral circuits) included in the function blocks IP1, IP2 and IPN may be supplied from the first power sources PS1-1, PS1-2 and PS1-N with the first power supply voltages VDD1-1, VDD1-2 and VDD1-N that are dynamically changed according to operating conditions (e.g., throughputs or operating speeds) of the corresponding function blocks IP1, IP2 and IPN, respectively.

The power path controllers 400, 402 and 404 may be respectively coupled to the first power sources PS1-1, PS1-2 and PS1-N, and may be commonly coupled to the second power sources PS2-1, PS2-2 and PS2-M. Thus, each power path controller 400, 402 and 404 may receive the corresponding first power supply voltage VDD1-1, VDD1-2 and VDD1-N from a corresponding one of the first power sources PS1-1, PS1-2 and PS1-N, and may receive the plurality of second power supply voltages VDD2-1, VDD2-2 and VDD2-M from the second power sources PS2-1, PS2-2 and PS2-M. That is, the plurality of second power sources PS2-1, PS2-2 and PS2-M may be shared by the plurality of power path controllers 400, 402 and 404. Accordingly, the SoC 300 according to exemplary embodiments may reduce the number of power sources in the PMIC 350, the number of passive elements in the PMIC 350 and the number of power supply lines between the PMIC 350 and the SoC 300.

The power path controllers 400, 402 and 404 may be respectively coupled to a plurality of memory cores MC1, MC2 and MCN included in the function blocks IP1, IP2 and IPN respectively. The memory core MC1, MC2 and MCN in each function block IP1, IP2 and IPN may be supplied with power through a corresponding one of the power path controllers 400, 402 and 404. Each power path controller (e.g., 400) may selectively transfer the corresponding first power supply voltage (e.g., VDD1-1) from the corresponding first power source (e.g., PS1-1), or a selected one of the plurality of second power supply voltages VDD2-1, VDD2-2 and VDD2-M to the corresponding memory core (e.g., MC1).

For example, to provide one of the first power supply voltage VDD1-1 and the second power supply voltages VDD2-1, VDD2-2 and VDD2-M, the power path controller 400 may include a first switch SW1 located between the first power source PS1-1 and the memory core MC1, a plurality of second switches SW2-1, SW2-2 and SW2-M located between the second power sources PS2-1, PS2-2 and PS2-M and the memory core MC1, respectively, and a switch controller 430 that selectively activates one of the first switch SW1 and the second switches SW2-1, SW2-2 and SW2-M.

As described above, the first power supply voltage VDD1-1 may be dynamically changed according to the operating condition of the corresponding function block IP1, and the second power supply voltages VDD2-1, VDD2-2 and VDD2-M may be power supply voltages having different voltage levels. In some exemplary embodiments, the minimum power supply voltage used by each memory core MC1, MC2 and MCN may be changed according to a temperature, a process variation, etc., and the second power supply voltages VDD2-1, VDD2-2 and VDD2-M may correspond to a plurality of minimum power supply voltages suitable for different temperatures or process variations. Further, the switch controller 430 of each power path controller 400 may activate the first switch SW1 and/or one of the second switches SW2-1, SW2-2 and SW2-M based on the temperature, the process variation, etc. of the corresponding memory core MC1 such that a power supply voltage greater than or equal to the minimum power supply voltage currently used by the memory core MC1 is supplied to the memory core MC1.

Figure 11:
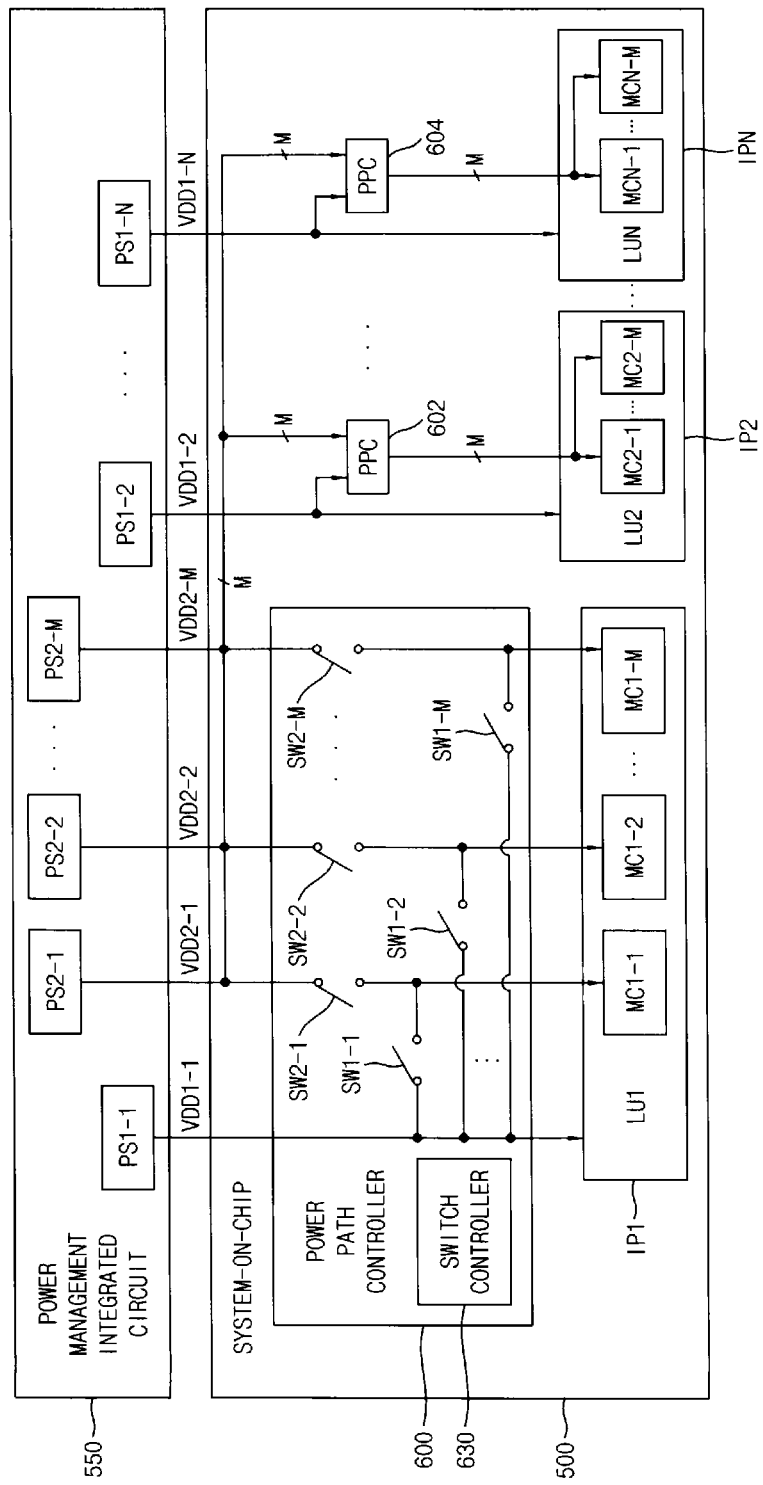
FIG. 11 is a block diagram illustrating a SoC including a power path controller according to exemplary embodiments.

FIG. 11 is a block diagram illustrating a SoC including a power path controller according to exemplary embodiments.

Referring to FIG. 11, a SoC 500 includes a plurality of function blocks IP1, IP2 and IPN and a plurality of power path controllers 600, 602 and 604. The SoC 500 may be supplied with power from a PMIC 550

In some exemplary embodiments, a plurality of logic units LU1, LU2 and LUN (or peripheral circuits) included in the function blocks IP1, IP2 and IPN, respectively, may be supplied from first power sources PS1-1, PS1-2 and PS1-N with a plurality of dynamically changed first power supply voltages VDD1-1, VDD1-2 and VDD1-N.

The power path controllers 600, 602 and 604 may be respectively coupled to the first power sources PS1-1, PS1-2 and PS1-N, and may be commonly coupled to a plurality of second power sources PS2-1, PS2-2 and PS2-M. Thus, each power path controller 600, 602 and 604 may receive the corresponding first power supply voltage VDD1-1, VDD1-2 and VDD1-N from a corresponding one of the first power sources PS1-1, PS1-2 and PS1-N, and may receive the plurality of second power supply voltages VDD2-1, VDD2-2 and VDD2-M from the second power sources PS2-1, PS2-2 and PS2-M. That is, the plurality of second power sources PS2-1, PS2-2 and PS2-M may be shared by the plurality of power path controllers 600, 602 and 604. Accordingly, the SoC 500 according to exemplary embodiments may reduce the number of power sources in the PMIC 550, the number of passive elements in the PMIC 550 and the number of power supply lines between the PMIC 550 and the SoC 500.

In some exemplary embodiments, each function block IP1, IP2 and IPN may include a plurality of memory cores MC1-1, MC1-2, MC1-M, MC2-1, MC2-M, MCN-1 and MCN-N, and each power path controller (e.g., 600) may provide the corresponding first power supply voltage VDD1-1 or a corresponding one of the second power supply voltages VDD2-1, VDD2-2 and VDD2-M to each memory core (e.g., MC1-1, MC1-2 and MC1-M).

For example, to provide the first power supply voltage VDD1-1 or the corresponding one of the second power supply voltages VDD2-1, VDD2-2 and VDD2-M to each memory core MC1-1, MC1-2 and MC1-M, the power path controller 600 may include a plurality of first switches SW1-1, SW1-2 and SW1-M located between the first power source PS1-1 and the memory cores MC1-1, MC1-2 and MC1-M, a plurality of second switches SW2-1, SW2-2 and SW2-M located between the second power sources PS2-1, PS2-2 and PS2-M and the memory cores MC1-1, MC1-2 and MC1-M, respectively, and a switch controller 630 that controls the first switches SW1-1, SW1-2 and SW1-M and the second switches SW2-1, SW2-2 and SW2-M.

Figure 12:
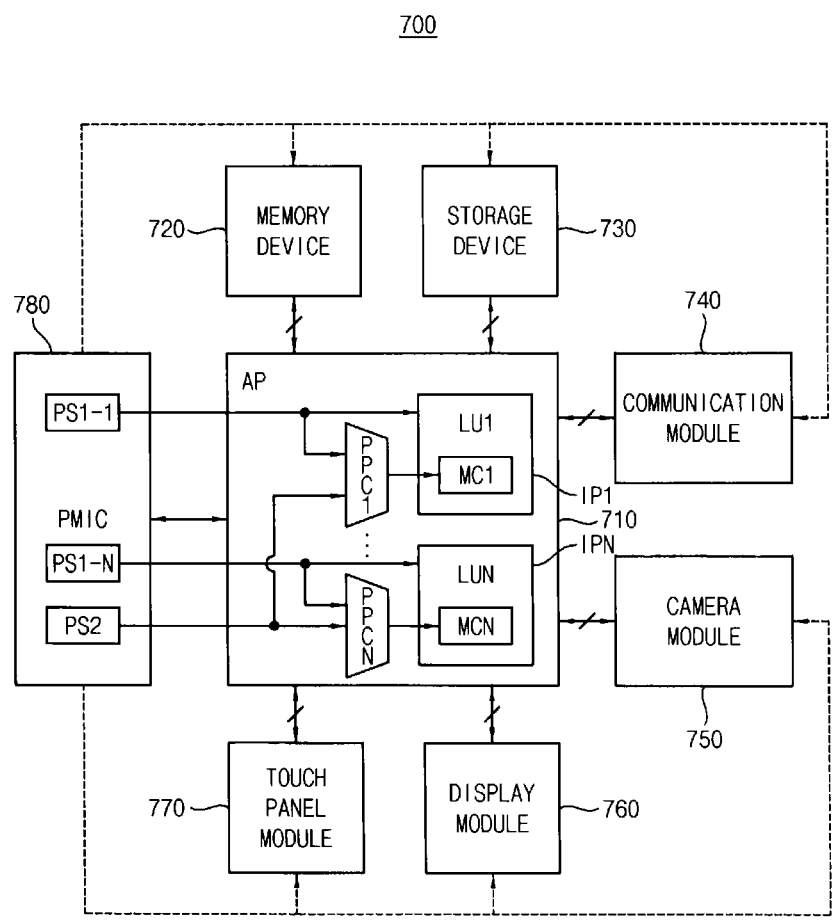
FIG. 12 is a block diagram illustrating a mobile device according to exemplary embodiments.
Figure 13:
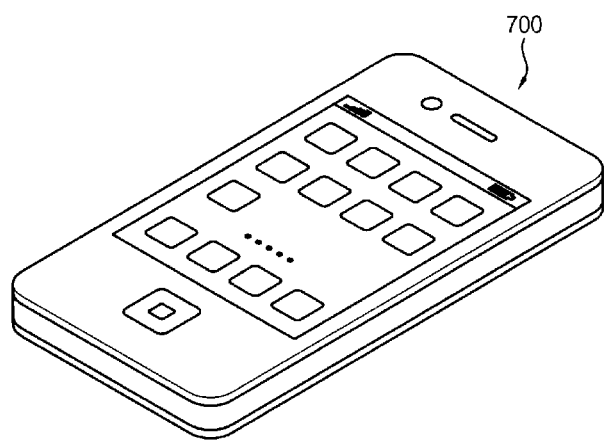
FIG. 13 is a schematic diagram illustrating an example in which the mobile device of FIG. 12 is implemented as a smart-phone.

FIG. 12 is a block diagram illustrating a mobile device according to exemplary embodiments, and FIG. 13 is a schematic diagram illustrating an example in which the mobile device of FIG. 12 is implemented as a smart-phone.

Referring to FIGS. 12 and 13, a mobile device 700 (or an electronic device) includes a SoC 710 and a PMIC 780. In some exemplary embodiments, the mobile device 700 may further include a plurality of devices or modules, such as a memory device 720, a storage device 730, a communication module 740, a camera module 750, a display module 760, a touch panel module 770, etc. For example, as illustrated in FIG. 13, the mobile device 700 may be implemented as a smart-phone.

The SoC 710 may control overall operations of the mobile device 700. For example, the SoC 710 may control the memory device 720, the storage device 730 and the plurality of modules 740, 750, 760 and 770. In some exemplary embodiments, the SoC 710 may be an application processor (AP) included in the mobile device 700.

The SoC 710 may be the SoC 100, 300 or 500 illustrated in FIGS. 1, 10 and 11, and may be supplied with power from the PMIC 780. The SoC 710 may include a plurality of function blocks IP1 and IPN and a plurality of power path controllers PPC1 and PPCN. A plurality of logic units LU1 and LUN included in the function blocks IP1 and IPN may be supplied with dynamically changed first power supply voltages from a plurality of first power sources PS1-1 and PS1-N included in the PMIC 780, respectively. The power path controllers PPC1 and PPCN may be respectively coupled to the first power sources PS1-1 and PS1-N included in the PMIC 780, and may be commonly coupled to at least one second power source PS2 included in the PMIC 780. The second power source PS2 may generate a second power supply voltage. The second power supply voltage may be set to a constant voltage. Each power path controller PPC1 and PPCN may selectively provide the dynamically changed first power supply voltage from the corresponding first power source PS1-1 and PS1-N or the fixed second power supply voltage from the second power source PS2 to a corresponding memory core MC1 and MCN. Accordingly, the SoC 710 according to exemplary embodiments may ensure a normal operation of the memory cores MC1 and MCN while reducing power consumption. Further, in the SoC 710 according to exemplary embodiments, the power path controllers PPC1 and PPCN may share (or may be commonly coupled to) the second power source PS2, thereby reducing the number of power sources, the number of passive elements and the number of power supply lines.

The memory device 720 and the storage device 730 may store data for operations of the mobile device 700. The memory device 720 may include a volatile memory device, such as a dynamic random access memory (DRAM), a SRAM, a mobile DRAM, etc. The storage device 730 may include a nonvolatile memory device, such as an erasable programmable read-only memory (EPROM), an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc. In some exemplary embodiments, the storage device 730 may further include a solid state drive (SSD), a hard disk drive (HDD), a CD-ROM, etc.

The plurality of modules 740, 750, 760 and 770 may perform various functions of the mobile device 700. For example, the mobile device 700 may include the communication module 740 that performs a communication function (e.g., a code division multiple access (CDMA) module, a long term evolution (LTE) module, a radio frequency (RF) module, an ultra-wideband (UWB) module, a wireless local area network (WLAN) module, a worldwide interoperability for a microwave access (WIMAX) module, etc.), the camera module 750 that performs a camera function, the display module 760 that performs a display function, the touch panel module 770 that performs a touch sensing function, etc. In some exemplary embodiments, the mobile device 700 may further include a global positioning system (GPS) module, a microphone (MIC) module, a speaker module, a gyroscope module, etc. However, the functional modules 740, 750, 760, and 770 in the mobile device 700 are not limited thereto.

Figure 14:
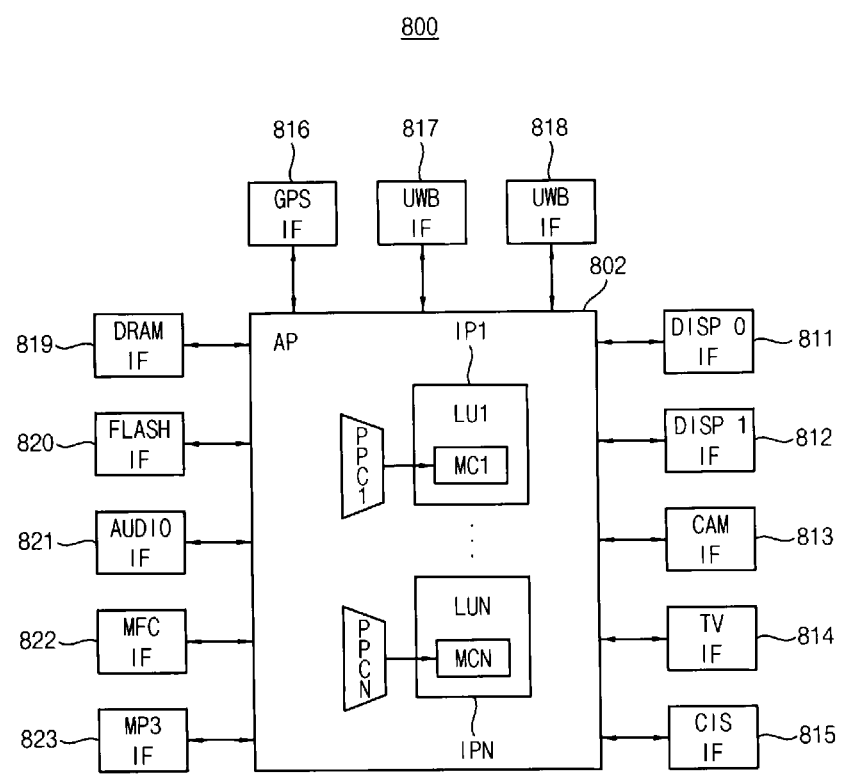
FIG. 14 is a block diagram illustrating an interface included in a mobile device according to exemplary embodiments.

FIG. 14 is a block diagram illustrating an interface included in a mobile device according to exemplary embodiments.

Referring to FIG. 14, a mobile device 800 includes a SoC 802 and a plurality of interfaces 811, 812, 813, 814, 815, 816, 817, 818, 819, 820, 821, 822 and 823. According to exemplary embodiments, the mobile device 800 may be any mobile device, such as a mobile phone, a smart phone, a tablet computer, a laptop computer, a personal digital assistants (PDA), a portable multimedia player (PMP), a digital camera, a portable game console, a music player, a camcorder, a video player, a navigation system, etc.

The SoC 802 controls overall operations of the mobile device 800. For example, the SoC 802 may be an application processor (AP) included in the mobile device 800.

The SoC 802 may communicate with each of a plurality of peripheral devices via each of the plurality of interfaces 811 through 823. For example, each of the interfaces 811 through 823 may transmit at least one control signal, which is output from a corresponding one of a plurality of function blocks IP1 and IPN, to each of the plurality of peripheral devices.

For example, the SoC 802 may control a power state and an operation state of each flat panel display device via each of display interfaces 811 and 812. The flat panel display device may include a liquid crystal display (LCD), a light emitting diode (LED) display, an organic light emitting diode (OLED) display or an active matrix organic light-emitting diode (AMOLED) display, etc.

The SoC 802 may control a power state and an operation state of a camcorder via a camcorder interface 813, may control a power state and an operation state of a TV module via a TV interface 814, and may control a power state and an operation state of a camera module or an image sensor module via an image sensor interface 815.

The SoC 802 may control a power state and an operation state of a GPS module via a GPS interface 816, may control a power state and an operation state of a UWB module via a UWB interface 817, and may control a power state and an operation state of an universal serial bus (USB) drive via a USB drive interface 818.

The SoC 802 may control a power state and an operation state of a DRAM via a DRAM interface 819, may control a power state and an operation state of a nonvolatile memory device (e.g., a flash memory) via a nonvolatile memory interface 820 (e.g., a flash memory interface), may control a power state and an operation state of an audio module through an audio interface 821, may control a power state of a multi-format codec (MFC) through an MFC interface 822, and may control a power state of an MP3 player through an MP3 player interface 823. For example, a module or an interface may be implemented in hardware or software.

The SoC 802 may be the SoC 100, 300 or 500 illustrated in FIGS. 1, 10 and 11. The SoC 802 may include a plurality of function blocks IP1 and IPN and a plurality of power path controllers PPC1 and PPCN. A plurality of logic units LU1 and LUN included in the function blocks IP1 and IPN may be supplied with dynamically changed first power supply voltages, respectively. Each power path controller PPC1 and PPCN may selectively provide the dynamically changed first power supply voltage or a second power supply voltage to a corresponding memory core MC1 and MCN. The second power supply voltage may be set to a constant voltage. Accordingly, the SoC 802 according to exemplary embodiments may ensure a normal operation of the memory cores MC1 and MCN while reducing power consumption. Further, in the SoC 802 according to exemplary embodiments, the power path controllers PPC1 and PPCN may share (or may be commonly coupled to) the second power source, thereby reducing the number of power sources, the number of passive elements and the number of power supply lines.

Figure 15:
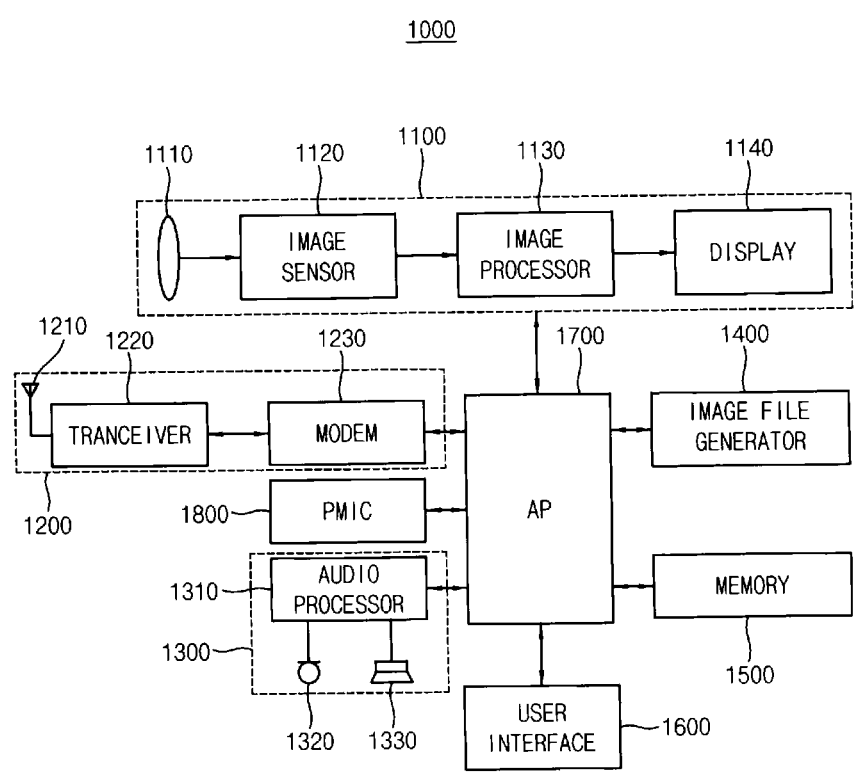
FIG. 15 is a block diagram illustrating an electronic device according to exemplary embodiments.

FIG. 15 is a block diagram illustrating an electronic device according to exemplary embodiments.

Referring to FIG. 15, an electronic device 1000 includes an image processing block 1100, a wireless transceiving block 1200, an audio processing block 1300, an image file generator 1400, a memory 1500, a user interface 1600, an application processor 1700 and a PMIC 1800.

The image processing block 1100 may include a lens 1110, an image sensor 1120, an image processor 1130 and a display 1140. The wireless transceiving block 1200 may include an antenna 1210, a transceiver 1220 and a modem 1230. The audio processing block 1300 may include an audio processor 1310, a microphone 1320 or a speaker 1330.

The application processor 1700 may be the SoC 100, 300 and 500 illustrated in FIGS. 1, 10 and 11. The application processor 1700 may be supplied with a plurality of first power supply voltages respectively corresponding to a plurality of function blocks or a plurality of power domains from the PMIC 1800, and the first power supply voltages may be dynamically changed to reduce power consumption of the application processor 1700. Further, the application processor 1700 may be supplied with a second power supply voltage corresponding to a minimum power supply voltage used by a plurality of memory cores included in the application processor 1700 from the PMIC 1800. The second power source supply voltage may be set to a constant voltage. The application processor 1700 may selectively provide the first power supply voltage or the second power supply voltage to each memory core by using a plurality of power path controllers respectively corresponding to the plurality of memory cores, and thus may ensure the normal operation of the memory cores while reducing the power consumption. Further, the application processor 1700 may receive the second power supply voltage from a single or reduced number of power sources, thereby reducing the number of power sources, the number of passive elements and the number of power supply lines.

The exemplary embodiments disclosed herein may be used in various kinds of SoCs or a system including the SoCs, such as a mobile phone, a smart phone, a PDA, a PMP, a digital camera, a digital television, a set-top box, a music player, a portable game console, a navigation device, a PC, a server computer, a workstation, a tablet computer, a laptop computer, a smart card, a printer, etc.

The foregoing is illustrative of exemplary embodiments and is not to be construed as limiting thereof. Although a few exemplary embodiments have been described, those skilled in the art will readily appreciate that many modifications are possible to the exemplary embodiments without materially departing from the novel teachings and advantages of the present disclosure. Accordingly, all such modifications are intended to be included within the scope of the present disclosure as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A power path controller included in a system-on-chip (SoC), the power path controller coupled to a first power source and a second power source, the power path controller comprising:
    a first switch located between the first power source and a memory core included in the SoC;
    a second switch located between the second power source and the memory core;
    a comparator configured to compare a first power supply voltage supplied from the first power source with a second power supply voltage supplied from the second power source; and
    a switch controller configured to selectively activate the first switch or the second switch according to a comparison result of the comparator,
    wherein the first power supply voltage is a power supply voltage that is dynamically changed according to an operating condition of a function block including the memory core, and
    wherein the second power supply voltage is a power supply voltage that is set to a minimum power supply voltage used by the memory core.

2. The power path controller of claim 1, wherein the switch controller activates the first switch when a voltage level of the first power supply voltage is greater than a voltage level of the second power supply voltage, and activates the second switch when the voltage level of the first power supply voltage is less than the voltage level of the second power supply voltage.

3. The power path controller of claim 1, wherein the first power supply voltage is supplied to a logic block included in the function block.

4. The power path controller of claim 1, wherein the second power source is shared by the power path controller and another power path controller included in the SoC.

5. The power path controller of claim 1, further comprising:
a first resistor coupled between the switch controller and the first switch; and
a second resistor coupled between the switch controller and the second switch.

6. The power path controller of claim 1, wherein the first switch includes a first PMOS transistor having a gate receiving a first switching signal generated by the switch controller, a source coupled to the first power source, and a drain coupled to the memory core, and
wherein the second switch includes a second PMOS transistor having a gate receiving a second switching signal generated by the switch controller, a source coupled to the second power source, and a drain coupled to the memory core.

7. The power path controller of claim 1, wherein the comparator is a hysteresis comparator.

8. The power path controller of claim 7, wherein a hysteresis voltage of the hysteresis comparator is adjusted in response to a control code applied from an external circuit.

9. The power path controller of claim 1, further comprising:
a first low pass filter coupled between the first power source and a first input terminal of the comparator; and
a second low pass filter coupled between the second power source and a second input terminal of the comparator.

10. The power path controller of claim 9, wherein the first low pass filter includes:
a resistor coupled between the first power source and the first input terminal of the comparator;
a resistor coupled between the first input terminal of the comparator and a ground voltage; and
a first capacitor coupled between the first input terminal of the comparator and the ground voltage, and
wherein the second low pass filter includes:
a resistor coupled between the second power source and the second input terminal of the comparator;
a resistor coupled between the second input terminal of the comparator and the ground voltage; and
a second capacitor coupled between the second input terminal of the comparator and the ground voltage.

11. The power path controller of claim 1, wherein, when a voltage level of the first power supply voltage is greater than a voltage level of the second power supply voltage, the switch controller applies a first switching signal having a low level to the first switch, and applies a second switching signal having a high level to the second switch, and
wherein, when the voltage level of the first power supply voltage is lower than the voltage level of the second power supply voltage, the switch controller applies the first switching signal having the high level to the first switch, and applies the second switching signal having the low level to the second switch.

12. The power path controller of claim 11, wherein the switch controller includes:
an inverter configured to generate the first switching signal by inverting an output signal of the comparator, and to apply the first switching signal to the first switch;
an inverter configured to invert the output signal of the comparator; and
an inverter configured to generate the second switching signal by inverting an output signal of the inverted output signal of the comparator, and to apply the second switching signal to the second switch.

13. The power path controller of claim 1, wherein the switch controller includes:
a multiplexer configured to selectively output a control signal or an output signal of the comparator; and
a switching signal generator configured to generate a first switching signal applied to the first switch and a second switching signal applied to the second switch in response to an output signal of the multiplexer.

14. The power path controller of claim 13, wherein the control signal is an external control signal that is received from an external circuit.

15. The power path controller of claim 13, further comprising:
a detector configured to generate the control signal by detecting at least one of a temperature, a current and an operating speed of the memory core.

16. The power path controller of claim 1, wherein the first power supply voltage is a power supply voltage that is dynamically changed according to a throughput or operating speed of the function block.

17. A power path controller included in a system-on-chip (SoC), the power path controller coupled to a first power source and to a plurality of second power sources, the power path controller comprising:
a first switch located between the first power source and a memory core included in the SoC;
a plurality of second switches located between the second power sources and the memory core, respectively; and
a switch controller configured to selectively activate the first switch or one of the second switches such that a first power supply voltage supplied from the first power source or one of a plurality of second power supply voltages supplied from the second power sources is supplied to the memory core, the first power supply voltage being a dynamically changed power supply voltage, and the second power supply voltages being constant power supply voltages having different voltage levels from one another.

18. A power path controller included in a system-on-chip (SoC), the power path controller comprising:
a comparator comprising a first input that is configured to receive a first power supply voltage and a second input that is configured to receive a second power supply voltage;
a first switch that is electrically connected to the first input of the comparator and generates a first output provided to a memory core included in the SoC;
a second switch that is electrically connected to the second input of the comparator and generates a second output provided to the memory core; and
a switch controller electrically connected to an output of the comparator and to the first switch and the second switch, the switch controller selectively activating the first switch or the second switch according to the output of the comparator,
wherein the first power supply voltage is a power supply voltage that is dynamically changed according to an operating condition of a function block including the memory core, and
wherein the second power supply voltage is a power supply voltage that is set to a minimum power supply voltage used by the memory core.

19. The power path controller of claim 18, wherein the first switch comprises a first transistor having a gate electrically connected to the switch controller, a source electrically connected to the first input of the comparator, and a drain that provides the first output to the memory core; and the second switch comprises a second transistor having a gate electrically connected to the switching controller, a source electrically connected to the second input of the comparator, and a drain that provides the second output to the memory core.

20. The power path controller of claim 19, wherein the switch controller activates only the first transistor to supply the first power supply voltage to the drain of the first transistor when a voltage level of the first power supply voltage is greater than a voltage level of the second power supply voltage, and activates only the second transistor to supply the second power supply voltage to the drain of the second transistor when the voltage level of the first power supply voltage is less than the voltage level of the second power supply voltage.

* * * * *